(12) United States Patent
Yee et al.

(10) Patent No.: US 6,459,646 B1
(45) Date of Patent: Oct. 1, 2002

(54) BANK-BASED CONFIGURATION AND RECONFIGURATION FOR PROGRAMMABLE LOGIC IN A SYSTEM ON A CHIP

(75) Inventors: Wilson Yee, Pleasanton; Fung Fung Lee, Milpitas; Edmond Cheung, San Jose, all of CA (US)

(73) Assignee: Triscend Corporation, Mountain View, CA (US)

( * ) Notice: Subject to any disclaimer, the term of this patent is extended or adjusted under 35 U.S.C. 154(b) by 0 days.

(21) Appl. No.: 09/746,524

(22) Filed: Dec. 21, 2000

(51) Int. Cl.[7] ................................................ G11C 8/00
(52) U.S. Cl. ...................... 365/230.03; 365/51; 365/63
(58) Field of Search ............................. 365/230.03, 51, 365/63

(56) References Cited

U.S. PATENT DOCUMENTS

| | | | | |
|---|---|---|---|---|
| 5,175,836 A | * | 12/1992 | Morgan | 395/425 |
| 5,307,314 A | * | 4/1994 | Lee | 365/230.03 |
| 6,078,542 A | * | 6/2000 | Tomishima | 365/230.03 |
| 6,266,751 B1 | * | 7/2001 | Niescier | 711/147 |

* cited by examiner

*Primary Examiner*—Huan Hoang
(74) *Attorney, Agent, or Firm*—Blakely, Sokoloff, Taylor & Zafman LLP

(57) ABSTRACT

A method and system for the rapid and precise configuration of a bank of logic in a configurable system on a chip. The configuration memory array is partitioned into a plurality banks. Configuration circuitry is implemented for each bank. This allows for the configuration of one or more banks while the other banks remain operable.

18 Claims, 6 Drawing Sheets

BANK DEACTIVATION CIRCUIT DIAGRAM

BANK-BASED CONFIGURATION AND RECONFIGURATION FOR PROGRAMMABLE LOGIC IN A SYSTEM ON A CHIP

FIELD OF THE INVENTION

The present invention relates generally to the configuration of programmable logic in a configurable system on a chip, and more specifically to a system and method for the configuration, reconfiguration, and readback of a portion of the programmable logic array.

BACKGROUND

A recent development in microelectronics is the configurable system on a chip (CSoC). FIG. 1 is a block diagram of a configurable system on a chip. The system 100 shown in FIG. 1 includes those portions of a CSoC relevant to an embodiment of the present invention. The system integrates a CPU 105, an internal system bus 110, configuration logic 115 and programmable logic, also referred to as configurable system logic (CSL) 120. The various system resources are all interconnected, and communicating through the internal system bus 110, on a single piece of silicon. The internal system bus signals and various dedicated system resource signals that connect to the CSL 120 are collectively referred to as the configurable system interconnect or CSI 110. The CSL consists of a plane of configuration memory cells that typically could be static random access memory (SRAM) coupled to user logic. The memory cells are configured to a known value prior to the operation of the device. This configuration determines the behavior of the logic and allows a programmer to implement desired functionality. For example a user may implement basic logic functions such as counters, adders, and multipliers, or more complex digital logic systems such as universal asynchronous receiver transmitters (UARTs). Since the configuration memory space of a CSoC is randomly accessible as part of the CSI address space no other dedicated hardware is necessary to configure the configurable memory of CSL 120. The CPU 105 simply writes the configuration data to the appropriate configuration memory location.

A user may wish to reconfigure a portion of the user logic to provide a different functionality. For example, a user may wish to reconfigure a UART as something else or simply change the baud rate or the parity bit of the UART. To do this the entire CSL is deactivated, the reconfiguration is completed, and the CSL is reactivated. During the time the CSL is deactivated, none of the functionality implemented through the user logic is available.

FIG. 2 shows CSL 120 as discussed above in reference to FIG. 1. CSL 120 includes an array 201 of configuration memory cells that could be, for example, SRAM cells. The array of SRAM cells 201 could be single bits or alternatively could be 8 bit words or 32 bit words depending on bus length. Typically a SRAM based configuration memory array may contain hundreds of thousands of memory cells. Shown coupled to CSL 120 is configuration logic that includes row select circuitry 202 and column select circuitry 204, as well as other configuration circuitry 206. Typically, SRAM based configuration memory is configured a row or column at a time. Each bit, or word, may have to be sequentially accessed in order to write information into the memory cells. To configure or reconfigure any part of the device, the entire row or column of SRAM cells may be altered. The access time is increased because the entire row and column designating the configuration memory cells to be configured must be selected. Configuration by row and column may also interfere with surrounding logic. This can be avoided by insulating the surrounding logic, but this is cost prohibitive. Also, large arrays necessitate lengthy select lines and data lines. The longer lines degrade reliability. In a system, such as the CSoC, in which a processor, system bus, and programmable logic are all tightly coupled together, functions in the programmable logic are typically grouped into blocks. This makes the row/column configuration method even more inefficient.

SUMMARY OF THE INVENTION

A method and system are described for configuring the programmable logic of a configurable system on a chip. The array of system addressable configuration memory cells is partitioned into a plurality of banks. Configuration circuitry is implemented for each bank. While one or more of the banks is configured the other banks remain operable.

BRIEF DESCRIPTION OF THE DRAWINGS

The present invention is illustrated by way of example and not limitation in the figures of the accompanying drawings, in which like references indicate similar elements and in which.

DETAILED DESCRIPTION

An embodiment of the present invention will provide a more efficient method of reading from or writing to configuration memory in a CSoC. In one embodiment of the present invention the configuration memory is segmented into banks. Each bank is independently accessible and programmable. The independent accessibility allows for dynamic run-time partial reconfiguration without disrupting the operation of the remainder of the system.

An intended advantage of one embodiment of the present invention is to allow the reconfiguration of some programmable functions of a CSoC while those functions not being reconfigured remain operable. Another intended advantage of one embodiment of the present invention is to improve the reliability of control signals by reducing the length of select lines and data lines to the configuration memory of a CSoC. Another intended advantage of one embodiment of the present invention is to increase the access speed of the configuration circuitry of a CSoC by limiting the critical circuitry to within a bank boundary.

Figure 1:
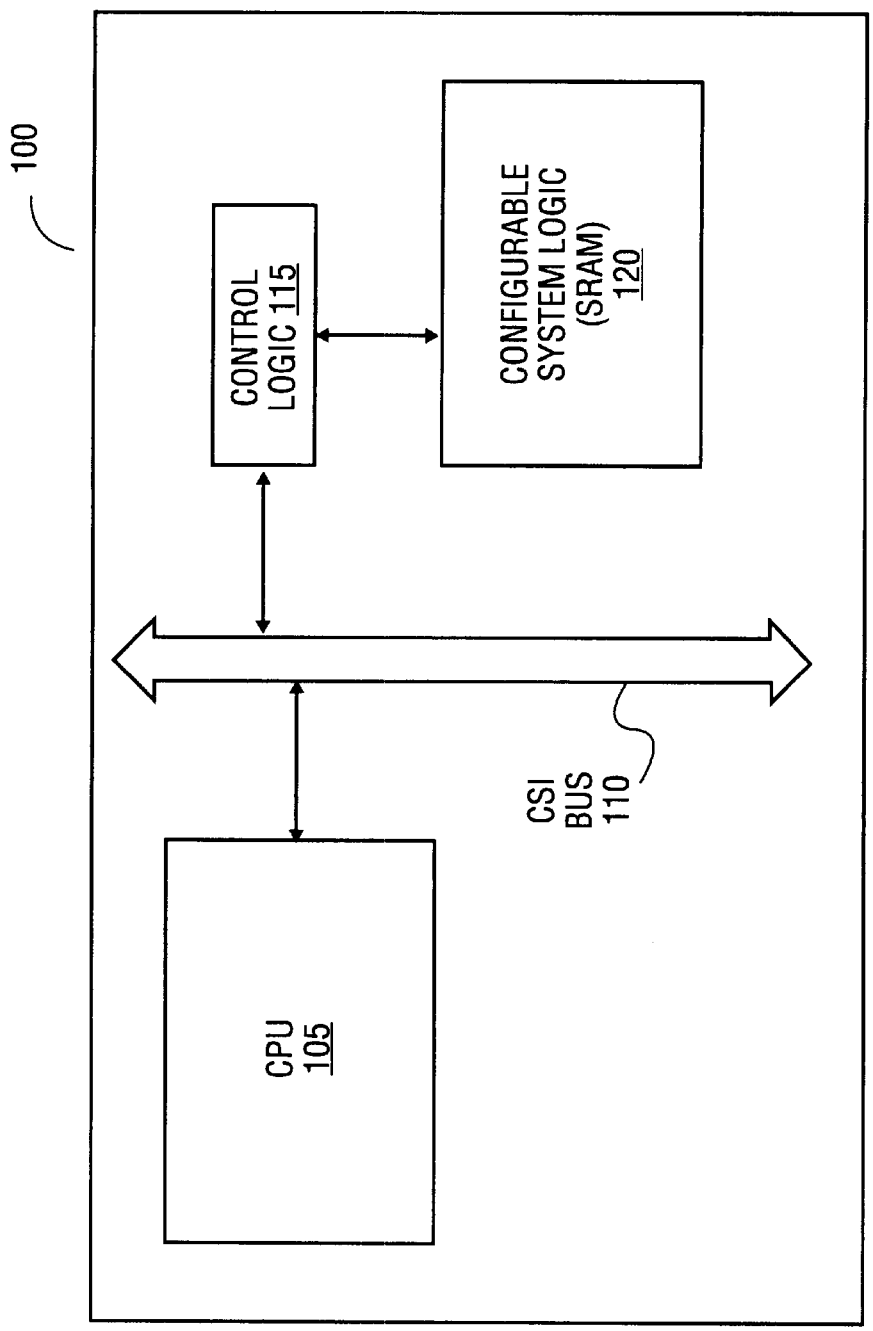
FIG. 1 is a block diagram of a configurable system on a chip.
Figure 2:
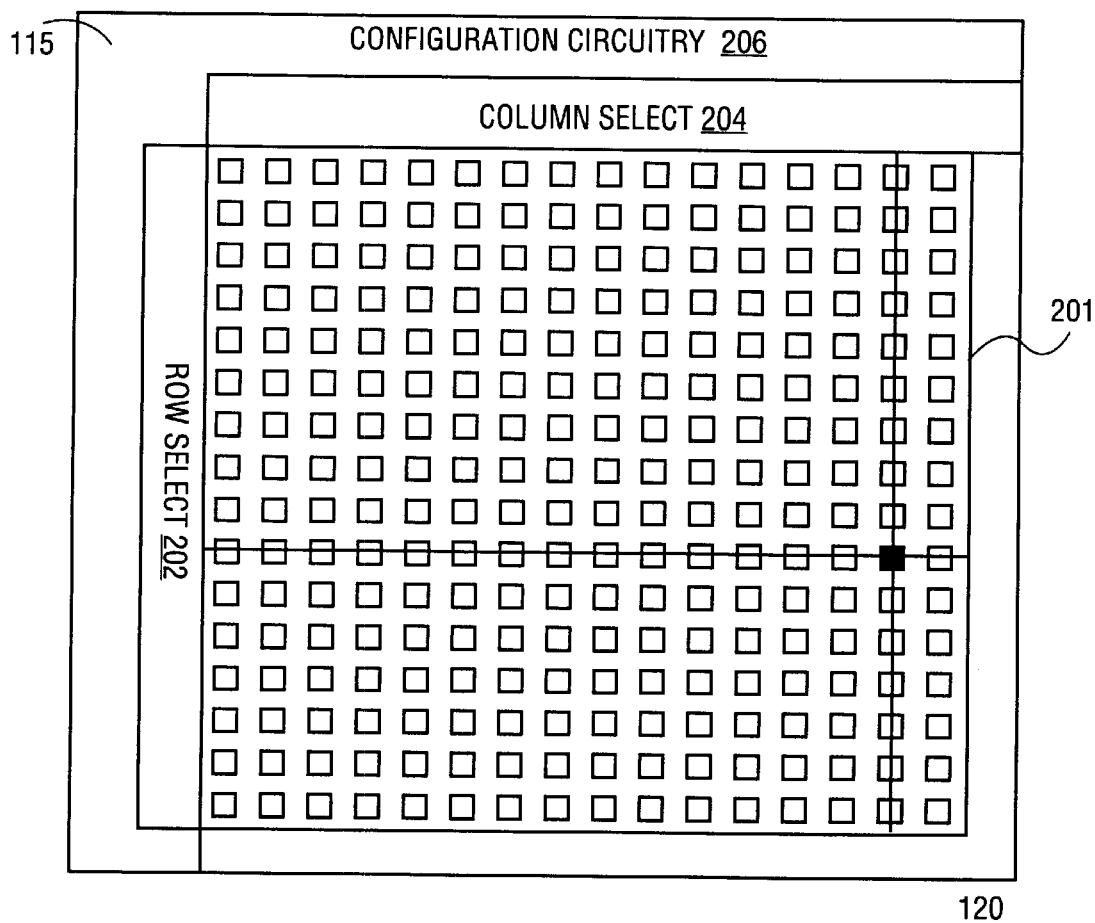
FIG. 2 is a block diagram of configuration memory and configuration circuitry.
Figure 3:
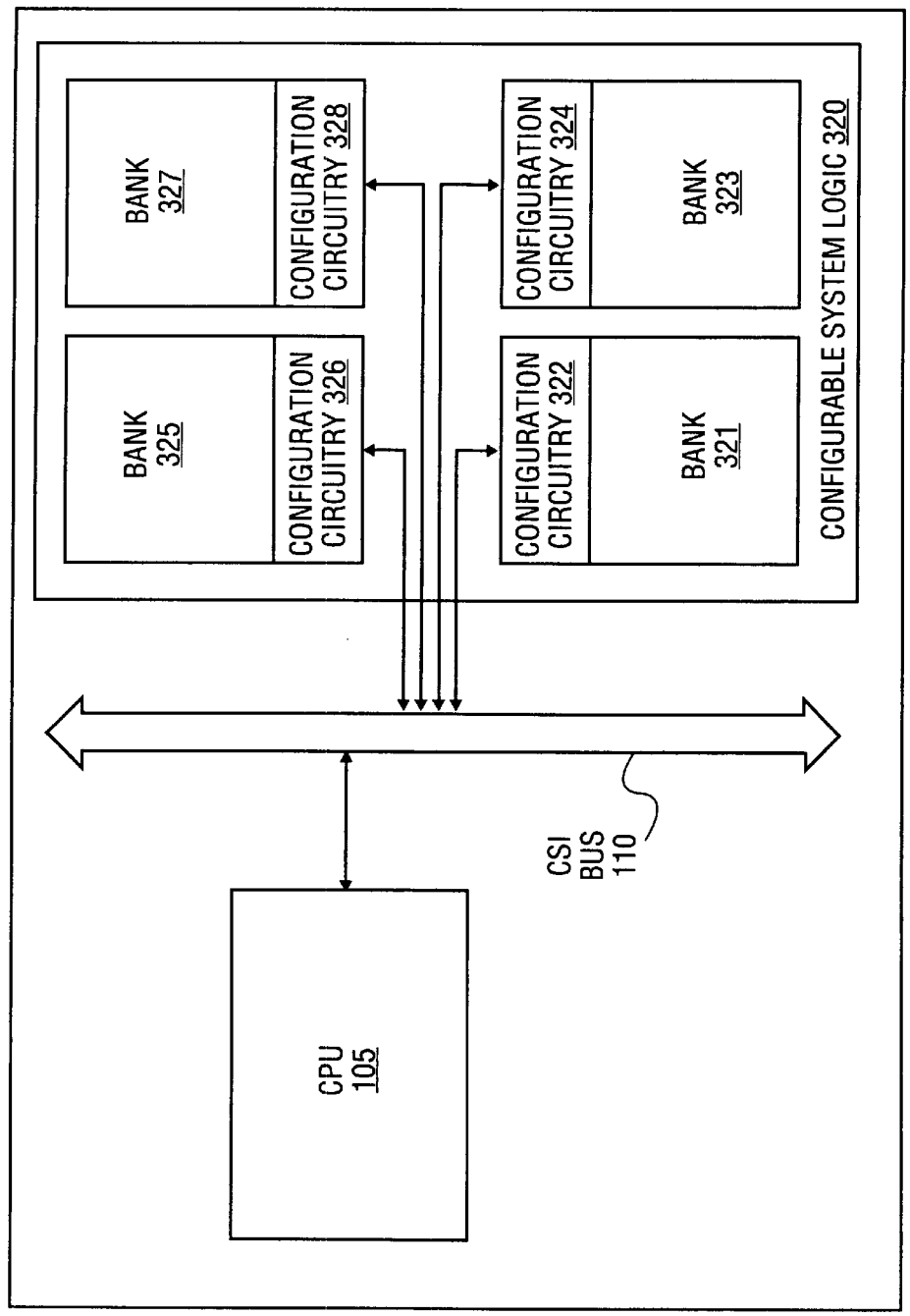
FIG. 3 is a block diagram of a configurable system on a chip according to the present invention.

FIG. 3 is a block diagram of a configurable system on a chip, according to the present invention. The system 300 shown in FIG. 3 includes those portions of a CSoC relevant to an embodiment of the present invention, although a variety of different computing systems can implement the present invention. The system includes a CPU 105 and an internal system bus 110 (CSI bus 110) as described above in reference to FIG. 1. In system 300, however, CSL 320 has been divided into banks. A bank is an arbitrary sized group of closely associated programmable logic cells. Each bank contains thousands of memory cells. In one embodiment a bank may be an array of 64 (8×8) logic block tiles with each tile having about 400 memory cells. In system 300, each bank 321, 323, 325, and 327 has its own dedicated set of built-in configuration circuitry 322, 324, 326, and 328 respectively. As discussed above, the configuration circuitry of each bank includes read/write control circuitry, row and column select circuitry, and other control signal circuitry such as a deactivation signal to disable many of the buffers in the programmable logic so there is no contention during the configuration sequence. This allows control of the programmable logic so it can be safely configured.

The critical circuits and timing requirements of the configuration circuitry are typically internal. Therefore, internally, the configuration circuitry 322, 324, 326, and 328 is contained within each bank 321, 323, 325, and 327 respectively. However, externally, the configuration circuitry 322, 324, 326, and 328 is connected together to allow control from a common configuration control circuitry over CSI bus 110. Alternatively, there could be a local configuration control circuitry for each bank. The local controller could interpret commands from a master controller and issue local control signals within each bus.

Because each bank of programmable logic has independent access to the processor, it is no longer necessary to deactivate the entire CSL when reconfiguring within one bank. For example, to partially configure one bank in a multi-bank array, global address decoders are used to generate a global row select and a global column select. The intersection of the generated row and column selects define the bank to be configured. Only the memory cells within the defined bank are altered. In an alternative embodiment a bank is selected for configuration through the use of address decoders within each bank that determine if the address range (addresses to be configured) are within the bank. There are many ways to ensure that the control signals from the CSI bus 110 only affect the behavior of a particular bank or group of banks and are masked at all other banks.

Figure 4:
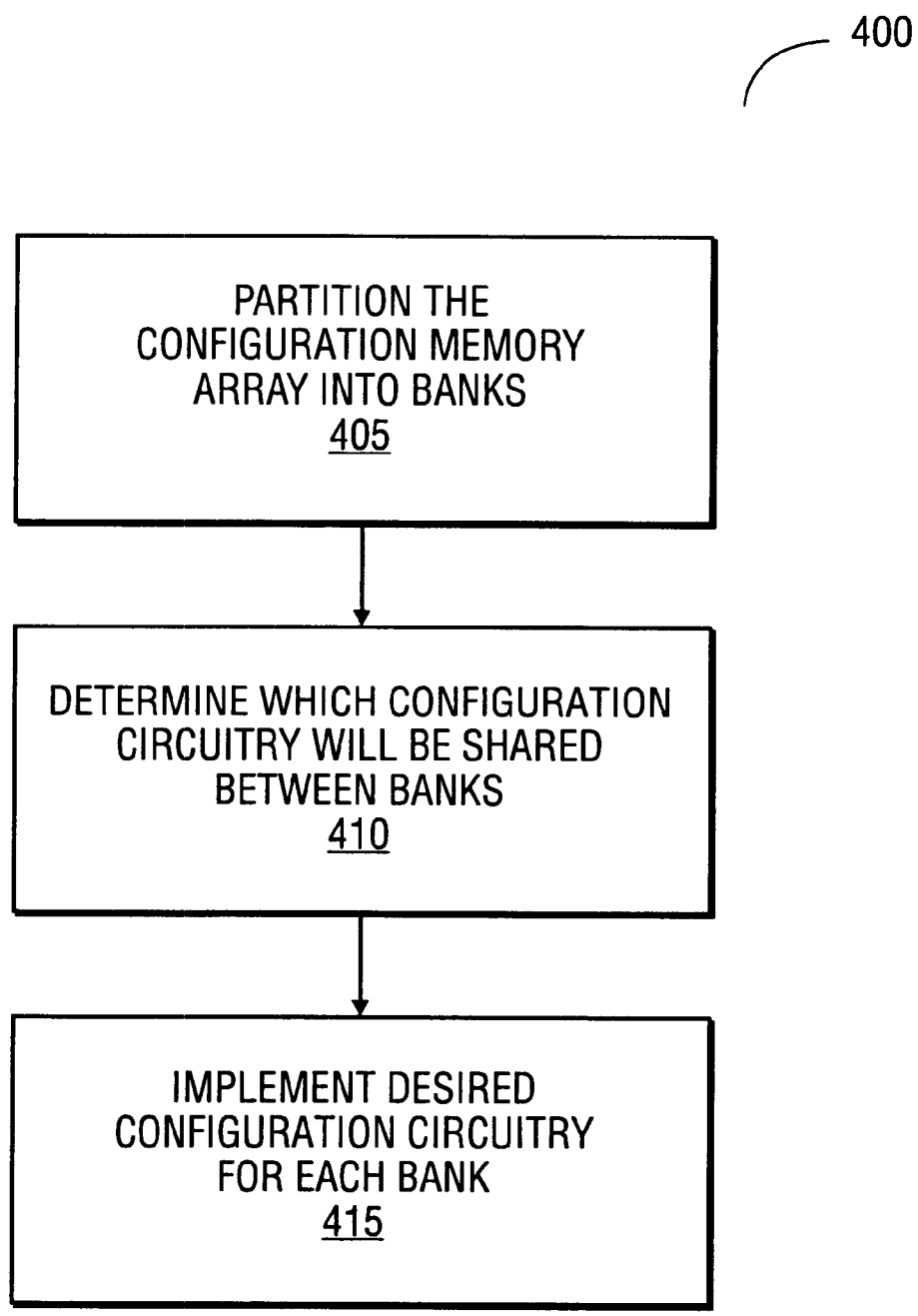
FIG. 4 is a process flow diagram of implementing one embodiment of the present invention.

FIG. 4 is a process flow diagram of one embodiment of the present invention. Process 400, shown in FIG. 4 begins at operation 405 in which an CsoC designer determines the optimum partitioning of a configuration memory array. As discussed above, functions in the programmable logic of a CSoC are typically grouped into blocks. Partitioning of the configuration memory array may be done to minimize the number of banks in which given implemented functions reside. Also, implementing configuration circuitry for each bank is more expensive than implementing global configuration circuitry. A CSoC designer may therefore consider cost and performance requirements.

At operation 410 an CSoC designer determines which of the required configuration circuitry can be shared between banks, and which banks can share which configuration circuitry. As discussed below in reference to FIG. 5, it is possible to have certain banks share some configuration memory.

At operation 415 the configuration circuitry that cannot be shared is implemented locally for each bank. For example, when a bank is to be configured it is first deactivated. If the deactivation control signal is shared between banks, all banks sharing the signal will be deactivated (i.e., the functionality of the banks would be inoperable). This would negate the benefit of being able to configure one bank while having remaining banks operable.

Figure 4A:
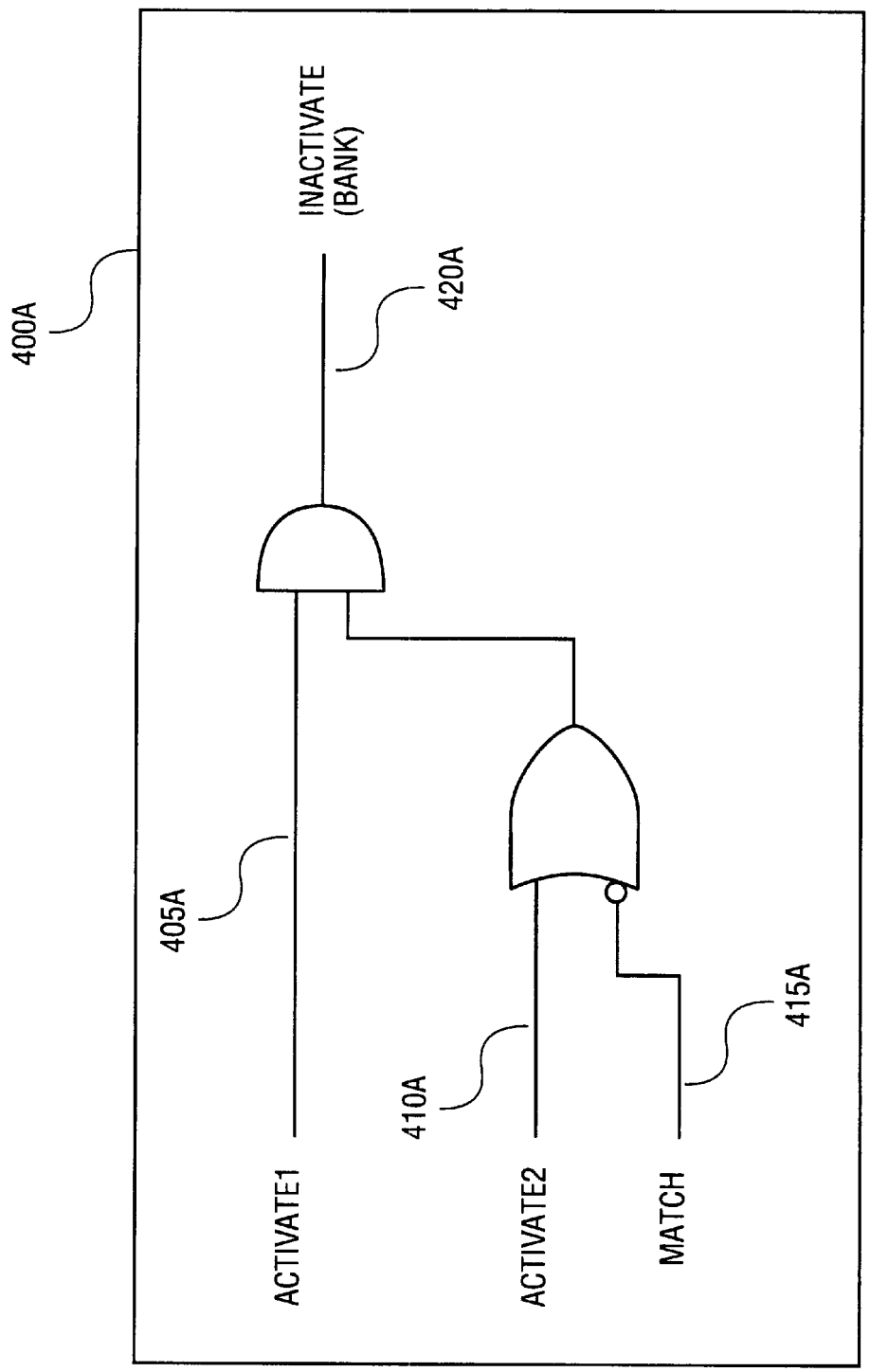
FIG. 4A shows a deactivation circuit that may be implemented in accordance with one embodiment of the present invention.

There are many ways of implementing a deactivation circuit. FIG. 4A shows a deactivation circuit that may be implemented in accordance with one embodiment of the present invention. The bank deactivation circuit 400A shown in FIG. 4A has a global deactivation signal activated, referenced as 405A, an activate2 signal, referenced as 410A and a match signal, referenced as 415A. Activate1 is used to globally deactivate every bank. When activate1 is logic low, all banks are deactivated regardless of the state of the activate2 or match signals. This global deactivation is the state used to configure the entire array.

Each bank is capable of generating its own match signal. The match signal 410A together with the activate2 signal 415A is used to selectively deactivate banks during partial reconfiguration. When activate1 is logic high and activate2 is logic low, the state of each bank is determined by the state of each bank's match signal. If a bank's match signal is logic high then the bank is deactivated. If the bank's match signal is logic low then the bank stays activated. Since each bank has its own match signal 410A, any of the banks may be deactivated while the others remain activated.

When activate 1 is logic high and activate2 is logic high, all banks are active regardless of the state of the match signal. This is the state used when partial reconfiguration is not being performed.

This partitioning of the configuration memory array into separate banks that can be independently deactivated, allows one or more banks to be configured while all others remain operable. As discussed above, the configuration memory of a CSoC is system addressable memory so no dedicated hardware is necessary to configure the configurable memory of CSL 120. The CPU 105 simply writes the configuration data to the appropriate configuration memory location. In an alternative embodiment, the bank is configured through use of a state machine, implemented at each bank, that runs configuration instructions from the CSI bus 110.

In accordance with the present invention when one bank is deactivated for configuration the remaining banks may be operable. For example, two UARTs may be implemented in the CSoC in two different banks. It is possible to keep one UART running while the other is reconfigured as something else.

The programmable memory array may be partitioned in as many banks as a CSoC designer desires. Each bank contains its own configuration circuitry that contains row and column select circuitry, read/write circuitry, as well as activation/deactivation circuitry among others. The expense of implementing this circuitry for many banks presents a tradeoff to the system designer as to how much of the configuration circuitry should be localized for each bank.

Figure 5:
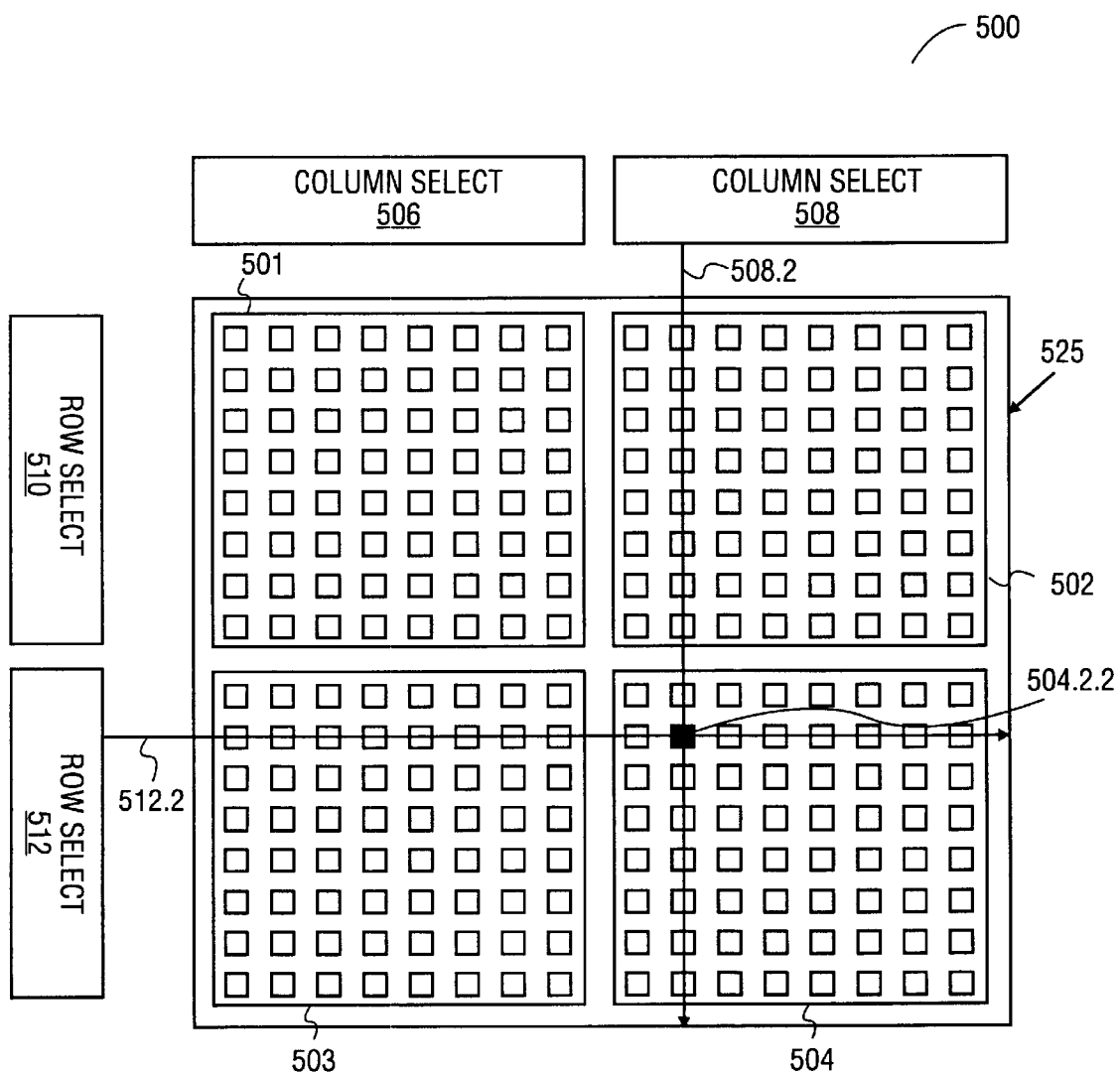
FIG. 5 shows multiple banks of a configuration memory array sharing configuration circuitry according to one embodiment of the present invention.

In an alternative embodiment some of the control circuitry is shared between banks. FIG. 5 shows multiple banks of a configuration memory array sharing configuration circuitry according to one embodiment of the present invention. The array of configuration memory cells 525 is partitioned into banks 501, 502, 503, and 504. Banks 501, 502, 503, and 504 are shown as square arrays, but it will be appreciated that the banks may be rectangular or irregular in alternative embodiments. Also shown are column select circuitry 506 and 508, and row select circuitry 510 and 512. In one embodiment, rows of banks (e.g., banks 501 and 502) share row select circuitry, and columns of banks (e.g., 501 and 503) share column select circuitry. As illustrated in FIG. 5, the intersection of column select signal 508.2 and row select signal 512.2, uniquely identify word 504.2.2 of bank 504, and thus defines the bank being accessed. Some of the control signals cannot be shared among banks (e.g., activation/deactivation signal) without defeating the purpose of bank partitioning.

The process of the present invention may be implemented through use of a machine-readable medium that includes any mechanism that provides (i.e., stores and/or transmits) information in a form readable by a machine (e.g., a computer). For example, a machine-readable medium includes read only memory (ROM); random access memory (RAM); magnetic disk storage media; optical storage media; flash memory devices; electrical, optical, acoustical, or other form of propagated signals (e.g., carrier waves, infrared signals, digital signals, etc.) etc.

It should be understood that the method and apparatus of the invention can be practiced with modification and alteration within the spirit and scope of the appended claims. The description is thus to be regarded as illustrative instead of limiting on the invention.

What is claimed is:

1. A method, implemented on a configurable-system-on-chip integrated circuit, the method comprising:
    partitioning an array of system addressable configuration memory cells into a plurality of banks, the partitioning determined based on the position of logic functions;
    implementing configuration circuitry for each bank; and
    configuring at least one bank such that remaining banks are operable.

2. The method of claim 1, wherein the at least one bank is determined by an address decoder associated with the at least one bank.

3. The method of claim 1, wherein portions of the configuration circuitry are shared by two or more banks.

4. The method of claim 3, wherein the portions of the configuration circuitry include column select circuitry.

5. The method of claim 3, wherein the portions of the configuration circuitry include row select circuitry.

6. An apparatus, implemented on a configurable system on a chip, comprising:
    means for partitioning an array of system addressable configuration memory cells of a configurable system on a chip into a plurality of banks, the partitioning determined based on the position of logic functions;
    means for implementing configuration circuitry for each bank; and
    means for configuring at least one bank such that remaining banks are operable.

7. The apparatus of claim 6, wherein the at least one bank is determined by an address decoder associated with the at least one bank.

8. The apparatus of claim 6, wherein portions of the configuration circuitry are shared by two or more banks.

9. The apparatus of claim 8, wherein the portions of the configuration circuitry include column select circuitry.

10. The apparatus of claim 8, wherein the portions of the configuration circuitry include row select circuitry.

11. A machine-readable medium that provides executable instructions, which when executed by a digital processing system, cause the set of processors to perform a method comprising:
    configuring at least one bank of a plurality of banks comprising a partitioned array of system addressable configuration memory, the partitioned array partitioned based on the position of logic functions;
    implementing configuration circuitry for each bank, such that remaining banks are operable.

12. The machine-readable medium of claim 11, wherein the at least one bank is determined by an address decoder associated with the at least one bank.

13. The machine-readable medium of claim 11, wherein portions of the configuration circuitry are shared by two or more banks.

14. The machine-readable medium of claim 13, wherein the portions of the configuration circuitry include column select circuitry.

15. The machine-readable medium of claim 13, wherein the portions of the configuration circuitry include row select circuitry.

16. A method, implemented on a configurable-system-on-chip integrated circuit, the method comprising:
    partitioning an array of system addressable configuration memory cells into a plurality of banks;
    implementing configuration circuitry for each bank; and
    configuring at least one bank such that remaining banks are operable, the at least one bank determined by the intersection of a global row select signal and a global column select signal.

17. An apparatus, implemented on a configurable system on a chip, comprising:
    means for partitioning an array of system addressable configuration memory cells of a configurable system on a chip into a plurality of banks;
    means for implementing configuration circuitry for each bank; and
    means for configuring at least one bank such that remaining banks are operable, the at least one bank is determined by the intersection of a global row select command and a global column select command.

18. A machine-readable medium that provides executable instructions, which when executed by a digital processing system, cause the set of processors to perform a method comprising:
    configuring at least one bank of a plurality of banks, the at least one bank determined by an address decoder associated therewith, the plurality of banks comprising a partitioned-array of system addressable configuration memory, the partitioned array partitioned based on the position of logic functions; and
    implementing configuration circuitry for each bank, such that remaining banks are operable.

* * * * *